(12) United States Patent
Sun et al.

(10) Patent No.: US 10,284,145 B2
(45) Date of Patent: May 7, 2019

(54) VARIABLE GAIN AMPLIFIER UTILIZING POSITIVE FEEDBACK AND TIME-DOMAIN CALIBRATION

(71) Applicant: BOARD OF REGENTS, THE UNIVERSITY OF TEXAS SYSTEM, Austin, TX (US)

(72) Inventors: Nan Sun, Austin, TX (US); Miguel Gandara, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/803,081

(22) Filed: Nov. 3, 2017

(65) Prior Publication Data

US 2018/0309408 A1 Oct. 25, 2018

Related U.S. Application Data

(60) Provisional application No. 62/416,805, filed on Nov. 3, 2016.

(51) Int. Cl.

| | |
|---|---|
| *H03M 1/12* | (2006.01) |
| *H03F 1/02* | (2006.01) |
| *H03F 1/08* | (2006.01) |
| *H03F 3/45* | (2006.01) |
| *H03K 3/356* | (2006.01) |
| *H03M 1/06* | (2006.01) |
| *H03M 1/14* | (2006.01) |

(Continued)

(52) U.S. Cl.
CPC ............ *H03F 1/0211* (2013.01); *H03F 1/08* (2013.01); *H03F 3/45179* (2013.01); *H03K 3/35613* (2013.01); *H03M 1/00* (2013.01); *H03M 1/06* (2013.01); *H03M 1/10* (2013.01); *H03M 1/12* (2013.01); *H03M 1/14* (2013.01)

(58) Field of Classification Search
CPC ............ H03M 1/00; H03M 1/14; H03M 1/12; H03M 1/06; H03M 1/10
USPC ................................. 341/156, 155, 118, 120
See application file for complete search history.

(56) References Cited

U.S. PATENT DOCUMENTS

| | | | |
|---|---|---|---|
| 7,167,027 | B2 | 1/2007 | Matsuo et al. |
| 7,408,409 | B2 | 8/2008 | Kern |

(Continued)

OTHER PUBLICATIONS

Chen, et al., "A 24-uW 11 BIT 1-MS/s SAR ADC with a bidirectional single-side switching technique," in 2014 IEEE ESSCIRC, Sep. 2014, pp. 219-222.

(Continued)

*Primary Examiner* — Joseph J Lauture
(74) *Attorney, Agent, or Firm* — Meunier Carlin & Curfman LLC

(57) ABSTRACT

A variable gain amplifier utilizing positive feedback and time-domain calibration includes an integration phase and a regeneration phase. A current source provides a bias current that increases linearity in the integration phase and reduces common-mode voltage dependence. The circuit includes a timing control loop, wherein a variable gain of a residue amplifier is proportional to a first time that a timing control loop signal is kept high, as determined by an on or off status of respectively paired inverter assemblies each having an input voltage determined by an amplifier output voltage during the regeneration phase. A strong-arm latch structure acts as a positive feedback latch until the first time is de-asserted.

20 Claims, 8 Drawing Sheets

(51) Int. Cl.
*H03M 1/10* (2006.01)
*H03M 1/00* (2006.01)

(56) References Cited

U.S. PATENT DOCUMENTS

| | | | |
|---|---|---|---|
| 8,928,357 | B1 | 1/2015 | El-Mansouri et al. |
| 9,520,891 | B1 * | 12/2016 | Kull .................. H03M 1/08 |
| 2002/0171453 | A1 | 11/2002 | Kanamori et al. |
| 2004/0155682 | A1 | 8/2004 | Sato |

OTHER PUBLICATIONS

Chen, et al., "Comparator common-mode variation effects analysis and its application in SAR ADCs," in 2016 IEEE ISCAS, in press, May 2016.

Lin, et al., "An ultralow-voltage 160 MS/s 7 bit interpolated pipeline ADC using dynamic amplifiers," IEEE Journal of Solid-State Circuits, vol. 50, No. 6, pp. 1399-1411, Jun. 2015.

Malki, et al., "A complementary dynamic residue amplifier for a 67 dB SNDR 1.36 mW 170 MS/s pipelined SAR ADC," in 2014 IEEE ESSCIR, Sep. 2014, pp. 215-218.

Murmann, et al., "A 12-bit 75-MS/s pipelined ADC using open-loop residue amplification," IEEE JSSC, vol. 38, No. 12, pp. 2040-2050, Dec. 2003.

Van der Goes, et al., "A 1.5 mW 68 dB SNDR 80 MS/s 2 Interleaved Pipelined SAR ADC in 28 nm CMOS," Solid-State Circuits, IEEE Journal of Solid-State Circuits, vol. 49, No. 12, pp. 2835-2845, Dec. 2014 doi: 10.1109/JSSC.2014.2361774.

Verbruggen, et al., "A 1.7 mW 11b 250 MS/s 2-times interleaved fully dynamic pipelined SAR ADC in 40 nm digital CMOS," IEEE JSSC, vol. 47, No. 12, pp. 2880-2887, Dec. 2012.

Wang, et al., "An 8-bit 150-MHz CMOS A/D converter," IEEE JSSC, vol. 35, No. 3, 4 pages, 1999.

Yu, et al., "A 9-bit 1.8-GS/s pipelined ADC using linearized open-loop amplifiers," in 2015 IEEE A-SSCC, Nov. 2015, pp. 1-4.

* cited by examiner

VARIABLE GAIN AMPLIFIER UTILIZING POSITIVE FEEDBACK AND TIME-DOMAIN CALIBRATION

CROSS REFERENCE TO RELATED APPLICATIONS

This application claims priority to and incorporates entirely by reference herein the United States Provisional patent application bearing U.S. Ser. No. 62/416,805 filed on Nov. 3, 2016, and entitled VARIABLE GAIN AMPLIFIER UTILIZING POSITIVE FEEDBACK AND TIME-DOMAIN CALIBRATION.

BACKGROUND

In discrete-time systems, including analog to digital converters (ADCs), a voltage amplifier may be necessary to increase the signal swing for further processing. Traditional precision amplification techniques, including closed-loop amplifiers, become less viable in nanometer-scale processes due to reduced transistor intrinsic gain. Additionally, these devices generally consume static power, which becomes a larger percentage of overall power consumption as dynamic power decreases with further device scaling.

Recently, interest has grown in using dynamic amplifiers in discrete-time systems. These amplifiers consume no static power, allowing for increased power efficiency as devices scale. Additionally, these devices are generally constructed in open-loop configurations, which greatly reduce the gain requirements for the amplifier. However, these dynamic amplifiers suffer from their own limitations, including increased sensitivity to process variation and inaccurate gain.

Traditional precision amplification techniques, including closed-loop amplifiers, become less viable as complementary metal-oxide-semiconductor (CMOS) devices continue to scale to smaller sizes. In order to achieve the desired closed-loop gain in the presence of process variation, an open-loop gain many times larger than the desired gain is required. Nanometer-scale devices suffer from reduced intrinsic gain, which limits the maximum achievable open-loop gain.

Successive approximation register (SAR) ADCs are very popular for medium resolution (8-10 bits) applications because of their mostly digital architecture and high power efficiency. One drawback of this architecture is that the capacitive digital-to-analog converter (CDAC) size doubles with each additional bit. At higher resolutions, this can cause the reference energy and area to grow prohibitively large. Each additional bit also requires an additional comparison, which can limit the overall speed of the converter. One method to address these issues is to split the SAR into multiple pipelined stages. Pipelining allows the CDAC to be sized only according to sampling noise constraints and reduces the number of serial conversions per conversion cycle. The main drawback to this approach is the requirement of residue amplification between each stage. As noted above, traditional closed-loop residue amplifiers require large open-loop gains. In advanced processes, achieving a high gain is limited by small transistor intrinsic gain and reduced voltage supplies, which limits cascaded transistor stacks. Moreover, these amplifiers consume static power, which limits the power efficiency when compared to a standard single-stage SAR architecture.

Many recent works have proposed alternatives to traditional closed-loop residue amplifiers. One option is to perform open-loop residue amplification, greatly reducing the required amplifier gain. The drawback to this approach is increased amplifier non-linearity, which can require complex digital calibration (see B. Murmann and B. E. Boser, "A 12-bit 75-MS/s pipelined ADC using open-loop residue amplification," IEEE JSSC, vol. 38, no. 12, pp. 2040-2050, December 2003.) Even when linearization techniques are used to remove the calibration requirement as in (L. Yu, M. Miyahara, and A. Matsuzawa, "A 9-bit 1.8-GS/s pipelined ADC using linearized open-loop amplifiers," in 2015 IEEE A-SSCC, November 2015, pp. 1-4), the amplifier still consumes static power. Other recent works have proposed using dynamic amplifiers, or integrators, for residue amplification. While integrator-based amplifiers are attractive because they achieve high power efficiency for a given input-referred noise, one drawback is that the maximum achievable gain is limited by the amplifier's component specifications, such as the ratio of select transistors' transconductance to respective transistor drain currents, i.e., transistor $g_m/I_D$, which is a measure of a transistor's efficiency in translating current to a transconductance (current gain). The allowable output common-mode voltage change, which is limited by the voltage supply, also affects maximum achievable gain. In some instances, this issue has been addressed by using a cascade to perform a double integration, which extends the allowable common-mode change, but the maximum gain is still limited. In B. Malki et al., "A complementary dynamic residue amplifier for a 67 dB SNDR 1.36 mW 170 MS/s pipelined SAR ADC," in 2014 IEEE ESSCIRC, September 2014, pp. 215-218, the allowable common-mode change is extended by using both NMOS and PMOS transistors. In theory, multiple complementary phases can be used to achieve large gains, however the timing complexity is increased for each added phase. Another issue for most residue amplifier architectures is the mismatch between comparator and amplifier offsets. Offset mismatch both increases the amplifier's input swing and can cause over-ranging in later stage ADCs. Gain redundancy can relax the matching requirements to avoid over-ranging, but one bit of redundancy only allows for ½ LSB (Least Significant Bit) of offset mismatch between amplifier and comparator. These effects are especially harmful in dynamic-amplifier based pipelined SAR ADCs because 1) the linearity of dynamic amplifiers is generally much more sensitive to input swing than closed-loop amplifiers and 2) the first-stage resolution is generally high in order to maintain the SAR's power efficiency and limit the amplifier input swing, thus reducing the LSB size and the effectiveness of gain redundancy. In general, either large devices or offset calibration techniques must be used in order to meet the offset matching requirements.

One concept utilized in traditional SAR designs is the strong-arm latch. A strong arm latch, however, can only be used as a coarse amplifier. At the end of the strong-arm latch operation, one output will be at $V_{dd}$ (positive supply) and one output will be at ground (negative supply). These latches, therefore, are really only suitable for use as voltage comparators or for amplifying low swing digital signals. Another important metric for precision amplifiers is the input-to-output linearity. Even with a well-controlled timing loop, the base strong-arm latch structure will have a gain that is highly dependent on the input voltage, which causes non-linearity in the input to output relationship.

The above noted limitations of traditional SAR designs are in addition to inherent problems in other traditional analog amplifier structures, where process scaling means increased difficulty in achieving precise gain.

Therefore, systems and methods are desired that overcome challenges in the art, some of which are described above.

SUMMARY

Described herein is a variable gain amplifier utilizing positive feedback and time-domain calibration that overcomes the scaling problem by amplifying in an open-loop configuration, significantly decreasing the required amplifier gain. The open-loop gain can be tuned to its desired value through the use of a digital timing loop. This shifts the complexity of achieving a precise gain from the analog domain to the digital domain, where device scaling is beneficial instead of deleterious.

The disclosed variable gain amplifier utilizing positive feedback and time-domain calibration uses a combination of integration and positive feedback regeneration in order to achieve high-speed amplification. Noise and linearity can be traded off for increased speed by adjusting the lengths of the integration and amplification phases. Additionally, the issues of process sensitivity and inaccurate gain can be overcome by implementing a time-domain based calibration technique. The total amplification time can be tuned in the background to provide a precise gain across process, voltage, and temperature variations.

The disclosed variable gain amplifier utilizing positive feedback and time-domain calibration is a technology-scaling friendly amplifier with variable gain. A traditional strong-arm latch, as described above, is modified by the design herein to make it suitable for precision amplification applications.

These two modifications, the digital timing loop and the current source, are two of the disclosed additions that enable a modified strong-arm latch structure to be used for precision amplification applications. The current source is added to improve the linearity and reduce common-mode voltage dependence. The timing control loop tunes the amplifier gain to its desired value. The gain is tunable by controlling the amplification time. The amplifier works in two amplification stages, integration and regeneration. The integration phase reduces input-referred noise and offset, and also provides increased linearity. The regeneration phase provides high-speed amplification. Noise and linearity can be traded off for increased speed by adjusting the lengths of the integration and amplification phases.

This architecture differs from other dynamic amplifiers through its use of positive feedback. The state of the art in dynamic amplifiers uses multi-stage integration to achieve dynamic gain. By replacing an integrator with a positive feedback latch in the second stage, higher speeds can be achieved with only a small loss in noise performance. Additionally, the presence of both an integration and regeneration phase allows for more flexible balancing between noise/linearity and speed than two-stage integration.

In one embodiment, a variable gain amplifier utilizing positive feedback and time-domain calibration includes an integration phase, wherein the integration phase reduces input-referred noise and offset, and provides increased linearity. The amplifier further includes a regeneration phase, wherein the regeneration phase provides high-speed amplification. A current source provides a bias current that increases linearity in the integration phase, reduces common-mode voltage dependence, and provides a dynamic mechanism to trade-off noise and linearity for speed. The amplifier accesses a timing control loop, wherein a variable gain of a residue amplifier is proportional to a time $\tau_{amp}$ that a timing control loop signal, clka, is kept high, as determined by an on or off status of respectively paired inverter assemblies each having an input voltage determined by an amplifier output voltage during the regeneration phase. The circuit implements a strong-arm latch structure, wherein once the amplifier is in the regeneration phase, the strong arm latch acts as a positive feedback latch until clka is deasserted, wherein the variable gain amplifier utilizing positive feedback and time-domain calibration consumes no static power.

In another embodiment, an analog to digital converter includes an initial coarse quantization phase for an analog input connected to a positive input terminal (Vin,p) and a negative input terminal (Vin,n), the coarse quantization phase includes a comparator clock input (clk) on respective gates of a first reset transistor (M7), a second reset transistor (M8), a third reset transistor (M9), a fourth reset transistor (M10), and an enable transistor (M12), said reset transistors configured to initialize an amplifier comprising a set of internal amplifier nodes to a constant state and to minimize static current consumed by the amplifier, and said enable transistor (M12) is configured to enable current flow through the amplifier 110. First and second differential current transistors (M1, M2) are connected, respectively, between a first cascode transistor (M3), enable transistor (M12), and second cascode transistor (M4) and enable transistor (M12). A constant bias current from the source terminals of M1 and M2 to ground is determined by a bias voltage (Vbias) on a current source transistor gate (M13). First and second cascode transistors (M3, M4) are connected between respective differential current transistors (M1, M2) and respective output terminals (Vop, Von), wherein during the integration phase, a differential current through transistors M1 and M2 is initially integrated on transistor parasitic capacitors (Cx) until a node voltage Vx drops to a voltage level that turns on cascode transistors (M3, M4) such that the differential current is then integrated onto an output load (Co) decreasing an output voltage at output nodes ($V_{op}/V_{on}$). A regeneration phase 125 for the initial differential voltage at output nodes ($V_{op}/V_{on}$) is initiated by the output voltage at nodes $V_{op}/V_{on}$ dropping to a lower voltage to turn on positive feedback transistors (M5, M6) connected between a common drain terminal (Vdd) and the output load (Co). The regeneration phase 125 includes a positive residue terminal (Vresp) and a negative residue terminal (Vresn) connected, respectively, to the first differential current transistor (M1) gate and second differential current transistor (M2) gate in a terminal polarity orientation (Vresn, Vresp) opposite the output terminals (Vop, Von). An amplifier clock input (clka) is configured to control the load capacitance until the gain applied to the residue input reaches a preset value.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3 shows gain of a variable gain amplifier utilizing positive feedback and time-domain calibration as a function of time where

DETAILED DESCRIPTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed, that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1A:
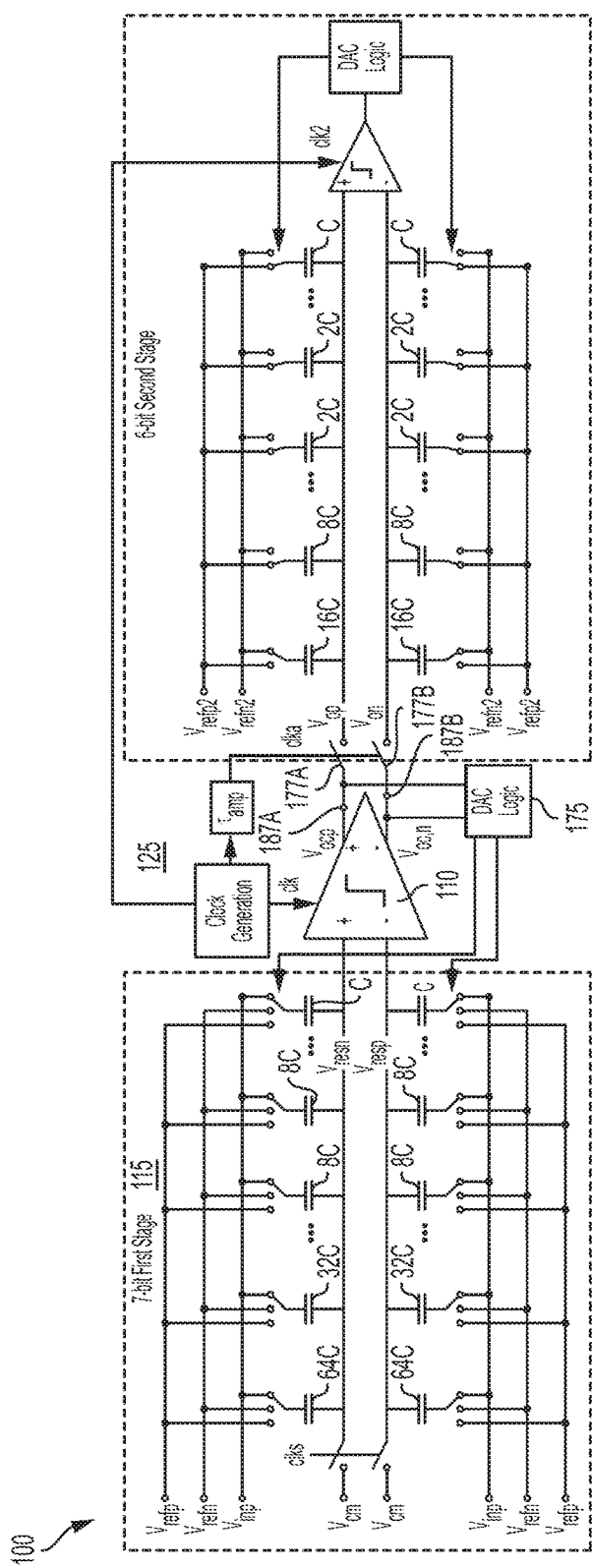
FIG. 1 shows an exemplary pipelined SAR architecture (FIG. 1A) that includes a variable gain amplifier utilizing positive feedback and time-domain calibration and timing diagram (FIG. 1B)
Figure 1B:
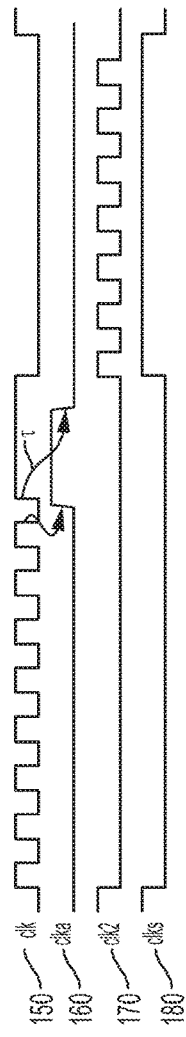

Described herein is a pipelined SAR architecture 100 that includes a variable gain amplifier 110 utilizing positive feedback and time-domain calibration, as shown in FIG. 1. The disclosed amplifier addresses the drawbacks of other dynamic amplifiers without adding any hardware complexity to the traditional SAR architecture and by reusing the first-stage comparator as a residue amplifier. The merged comparator/amplifier block 100 is based on a strong-arm latch architecture. This architecture maintains the noise filtering of an integrator, while adding a high-speed positive feedback gain phase. Additionally, the second stage SAR CDAC is used to limit the noise bandwidth of the amplifier 110 and meet the ADC's input-referred noise requirements. The achievable maximum gain is only limited by the ratio of supply voltage to input swing and the required second-stage linearity. The gain control only requires a simple tunable delay line. Because the amplifier and comparator are the same block, no offset calibration needs to be done to limit input swing or prevent over-ranging. By properly partitioning the pipeline stages, the first-stage residue can be kept small enough that the amplifier does not require any non-linearity calibration.

As shown in FIG. 1, four separate clock signals 150, 160, 170, 180 are applicable to the overall ADC circuit 100, which includes both a seven bit first stage bit registration 115 and a six bit second stage bit registration 125. Respective timing loops operable in the two phases include a first-stage comparator clock (clk) 150, an amplifier clock (clka) 160, a main sample clock (clks) 180, and a second-stage fine ADC clock (clk2) 170. The main sampling clock 180 for the ADC is denoted with signal clks. The input signal is sampled onto the Stage 1 SAR DAC during clks. This sampled input signal is then quantized by the Stage 1 SAR and the residual voltage after this quantization (Vresp/Vresn in FIGS. 1 and 2) is amplified for successive quantization of the fine second stage ADC. In other words, "clk" controls the successive quantization of the coarse 7-bit first stage SAR ADC 115, as well as the amplification onto the second stage SAR DAC 125 when clka is asserted; additionally, "clk2" controls the successive quantization of the fine second stage SAR ADC.

These clocks are controlled for high and low input by appropriate control logic, noted in FIG. 1 as DAC logic 175 for the respective phases of ADC operation. It is notable that by adding switches 177A, 177B at the output that are controlled by a digital timing loop, the strong-arm latch can now be used for precision amplification according to the disclosure herein.

Figure 2:
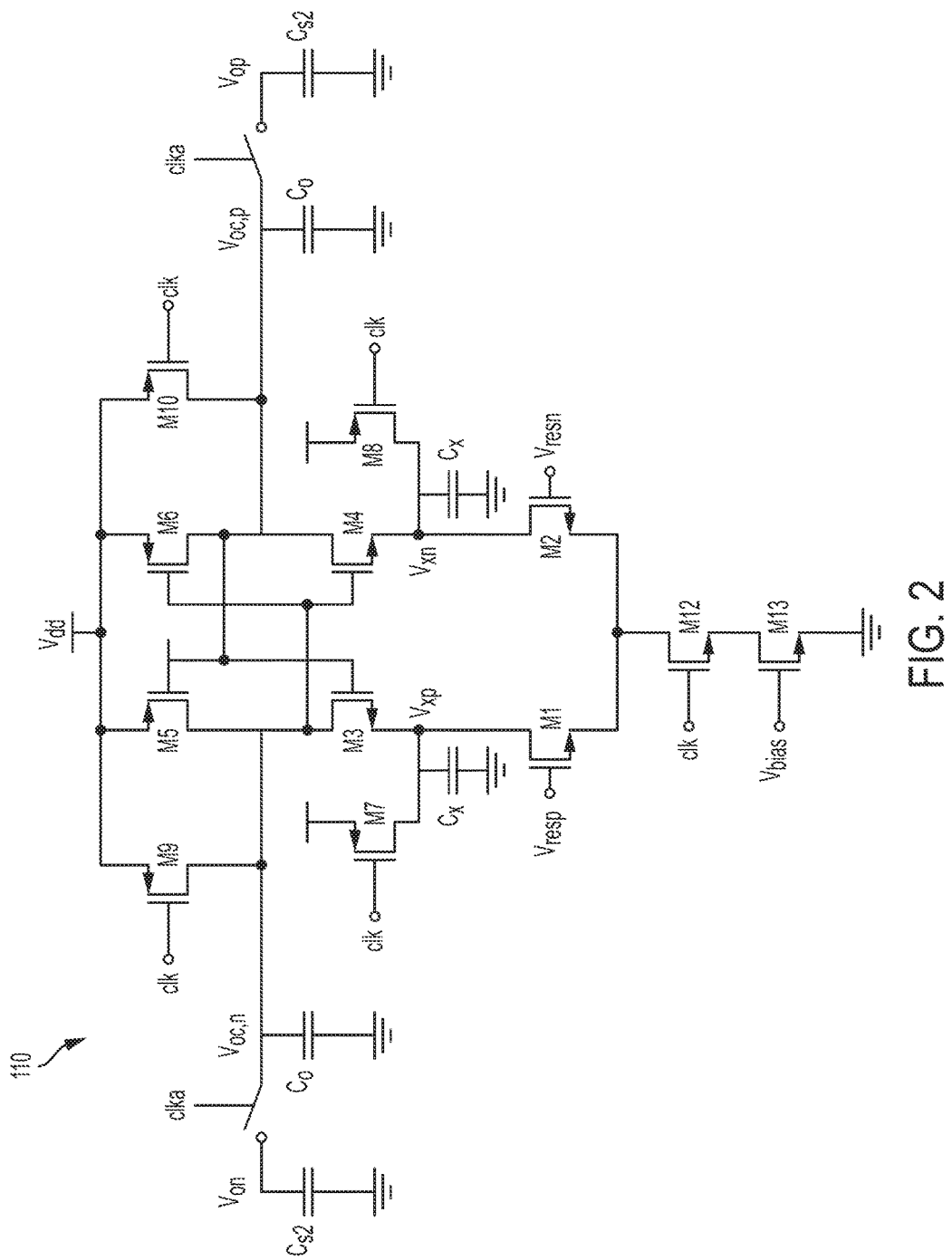
FIG. 2 shows a schematic of an exemplary embodiment of a strong-arm latch residue amplifier.

As shown in the associated figures, the switches 177A, 177B on the output of the amplifier have an open or closed state depending particularly on an amplifier clock input, clka, from the clock generation timing loop. FIG. 2 illustrates that these switches determine whether capacitance $C_{s2}$ is part of the output load capacitance. In one non-limiting description, the overall bank of capacitors in the 6 bit second stage registration may be considered, collectively, as $C_{s2}$. $C_{s2}$, referred to herein as second stage digital to analog "DAC" capacitance, is used for sampling and quantization to the amplified first-stage residue output from the positive feedback amplifier. By adding capacitance $C_{s2}$ at the strong arm latch output, a total capacitance of $C_o$ (parasitic capacitance) plus $C_{s2}$ increases the integration time of the amplifier, reducing the noise bandwidth and thus the input-referred noise.

In one embodiment, the timing control loop senses the amplifier gain at nodes Vop, Von shown in FIG. 2. In other words, a first timing loop includes the main sample clock (clks) sampling the input signal, a comparator clock (clk) for quantization in phase 1 bit registration, and an amplifier clock (clka). Each clock in the first timing loop can be turned on or off in planned sequences by utilizing switching signals determined by voltage asserted on select transistors in the overall circuit for the dual purpose comparator and amplifier structure. The switching circuitry shown in FIG. 2, therefore, can be used in whole or in part to assert and de-assert any one of the preferred clocks in the timing loop. By asserting and de-asserting the amplification clock, i.e., controlling the "clka" input in conjunction with select transistor status, the circuit 100 can be configured to tune an amplification time. The clka signal is asserted so that the amplifier output 187A, 187B will be sampled onto the second stage DAC capacitance, $C_{s2}$. When output voltage is sufficiently high for further quantization by the second stage 125, appropriate transistors in the ADC turn off, de-asserting clka and disconnecting the second stage digital to analog capacitance $C_{s2}$. With process scaling, the timing resolution of the loop will increase, which allows for even greater control of the amplifier gain.

In another non-limiting embodiment of an analog to digital converter, adding a current source to the strong-arm latch, such as the transistor (M13) of FIG. 2 controlled by a bias voltage $V_{bias}$, the gain becomes less dependent on the input voltage, increasing the linearity of the output. The addition of the current source (M13) also increases the common-mode rejection ratio of the amplifier. Additionally, by adjusting the bias current through the current source (FIG. 2, Ref. M13), noise and linearity can be traded off for increased speed.

A schematic of one embodiment of a strong-arm latch residue amplifier, which re-uses the Phase 1 comparator hardware, is shown in FIG. 2. FIG. 2 expresses an embodiment of the ADC presented herein with an operable arrangement of NMOS and PMOS transistors/inverters. The structure could also be modified to use respectively opposite PMOS and NMOS transistors (i.e., changing the polarity of the drain current in each) with the same resulting functionality. To first order, this is done by changing all NMOS transistors in the structure to PMOS transistors and vice-versa, and by changing all ground connections to Vdd and all Vdd connections to ground.

The latch of FIGS. 1 and 2 includes an added current bias ($V_{bias}$ directed to the gate of transistor M13) to improve the common mode (FIG. 1, $V_{cm}$) rejection of the amplifier 110. FIG. 2 corresponds to the amplifier circuit 100 shown in FIG. 1 with voltage input signals Vin,n and Vin,p representing the original analog input signal subject to digital conversion. During the 7-bit first stage quantization 115, the comparator operation proceeds with the comparator clock signal clk used for 1-bit quantization of the input analog signal. As shown in FIG. 2, when the clka signal is low, the comparator clock clk iteratively quantizes the difference between the input analog signal and the applied DAC voltage on $V_{resp}/V_{resn}$. Therefore, when clka is low, the second stage SAR capacitance $C_{s2}$ is disconnected from the amplifier, and the amplifier behaves as a normal comparator, comparing the voltages at nodes $V_{resp}/V_{resn}$.

The signal at clka is high upon the trailing edge of the clk signal completing a select number of cycles. As shown in FIG. 1, clka increases to its "on" state after a preset number of quantization pulses from the comparator clock, clk. When clka is high, the amplifier transfers the residue (FIG. 1, Vresn and Vresp) to the second stage SAR with a gain that is proportional to the time clka is kept high, $\tau_{amp}$. As described above, when clka is high, the switches 177A, 177B on the output are closed, and the output capacitance load is increased from Co to Co+Cs2 to increase integration time and to allow for sampling on the second-stage SAR capacitance.

The described amplifier operates in two gain phases, integration and regeneration. Each time that the "clk" signal goes high, as part of the coarse comparator operation (Phase 1) or the fine amplification/comparator operation (Phase 2), the integration and regeneration phases will occur as part of the normal operation of the amplifier. Referring to FIG. 2, during the integration phase, the differential current (through differential current transistors M1 and M2) is initially integrated on the capacitance at nodes $V_{xp}/V_{xn}$, $C_x$. Once the $V_x$ node voltages decrease enough to turn on intermediate transistors M3/M4, the differential current is then integrated onto the output load, the parallel combination of the second stage DAC capacitance, $C_{s2}$, and the comparator parasitic capacitance, $C_o$, until the voltage at nodes $V_{op}/V_{on}$ drops below the threshold voltage of p-type MOS (PMOS) transistors M5/M6, at which point the regeneration phase begins. For a simple naming convenience and without limiting the embodiments of this disclosure, PMOS transistors may be referred to as "positive feedback transistors M5 and M6." At the end of the integration phase, the integration gain $G_{int}$ will be:

$$G_{int} \approx \left(\frac{g_m}{I_D}\right)_{1,2} \left\{ V_{T5,6} + \frac{C_X}{C_{s2} + C_0}(V_{T5,6} + V_{T3,4}) \right\} \quad (1)$$

Once the amplifier is in the regeneration phase, it acts as a positive feedback latch until clka is de-asserted. At the end of the regeneration phase, the total amplifier gain, G, is:

$$G \approx G_{int} \cdot e^{T_{regen}/\tau} \quad (2)$$

where $T_{regen}$ is the total regeneration time and $\tau$ is the regeneration time constant, given by:

$$\tau \approx \frac{C_{s2} + C_0}{g_{m5,6}} \quad (3)$$

Figure 3A:
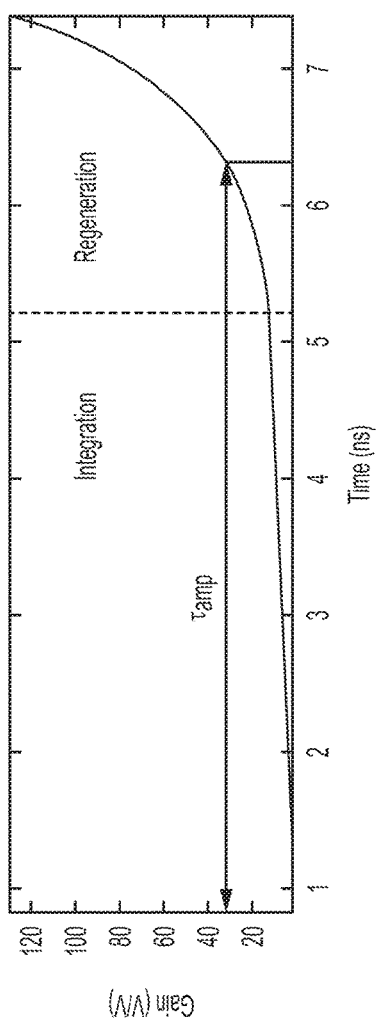
FIG. 3A shows amplifier gain and FIG. 3B shows input-referred noise.
Figure 3B:
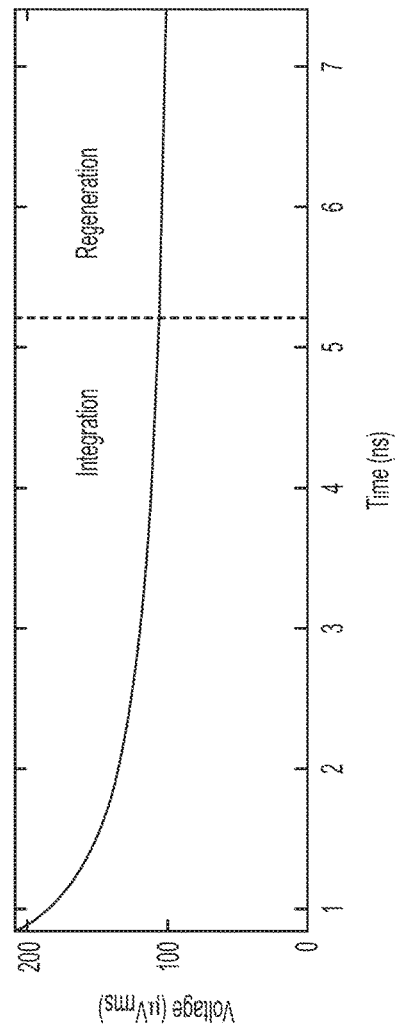

By the time the regeneration phase starts, the input differential transistor pair M1/2 is generally in the linear region, effectively degenerating intermediate transistors M3/4. In Equation 3, the effect of these degenerated transistors on the total latch transconductance $g_m$ is assumed to be negligible. FIG. 3 shows the amplifier gain as a function of time where FIG. 3A shows amplifier gain and FIG. 3B shows input-referred noise. During the integration phase, the gain grows linearly and in the regeneration phase the gain grows exponentially.

The positive feedback loop is shown in FIG. 2 as cross coupling the inverters formed by M3/M5 and M4/M6. The output of the M3/M5 inverter acts as the input to the M4/M6 inverter and the output of the M4/M6 inverter acts as the input to the M3/M5 inverter. When the bias signal at M13 is constant, the total current through M1 and M2 remains constant. The constant current of M13 (with the constant bias signal thereon) adds a level of control that is important for the integration time (and thus the amplifier gain) to be reliably constant. Referring to FIG. 2, $V_{oc,n}$=voltage between M3 and M5 and $V_{oc,p}$=voltage between M4 and M6. For an initial $V_{oc,n}$ that is larger than the initial $V_{oc,p}$ M4 has a higher input voltage than M3, causing $V_{oc,p}$ to decrease at a faster rate than $V_{oc,n}$; as $V_{oc,p}$ decreases (on the right side of FIG. 2), the input voltage to M5 increases, causing $V_{oc,n}$ to increase, and this causes the initial input voltage to be amplified at a high speed.

For the sake of completion in describing FIG. 2, transistors M7, M8, M9, and M10 are all reset transistors. M3, M4 are cascode transistors. M9 and M10 are used to reset the output voltages to Vdd at the end of comparison/amplification, so that the outputs will always start in the same state when future comparisons/amplifications are performed. M12 is an enable transistor, which enables current flow through the amplifier and enables the comparison/amplification operation. Vref1 and Vref2 are the reference voltages for the coarse and fine SAR DACs, respectively. They are used to generate the DAC voltages (by selectively connecting some DAC capacitances to the reference and others to ground) used during the successive approximation process.

An advantage of this amplifier topology is that its operation can easily be tuned for noise and speed requirements. In the integration phase, input-referred noise is inversely proportional to integration time (i.e., the time from the main sample clock initiating integration to the time that PMOS "positive feedback transistors M5, M6" are turned on), which is controlled by the bias current and load capacitance. In the regeneration phase, input-referred noise is inversely proportional to load capacitance. Additionally, the noise from the regeneration stage is attenuated by the gain from the integration stage. The input-referred noise plot of FIG. 3 shows that noise decreases during the integration phase and levels off once regeneration begins. For low speed and low noise designs, the integration time can be maximized by reducing the bias current. For high-speed designs with less stringent noise requirements, the bias current can be increased to minimize integration time. Whenever possible, the load capacitance should be minimized so that the regeneration phase can be as fast as possible while still meeting noise requirements. For a given integration time, the differential current transistors M1/M2 input pair's $g_m/I_D$ should be large so that the noise contribution from the regeneration phase is minimized. The upper limit on $g_m/I_D$ is the required linearity of the amplifier, since the integration gain becomes more non-linear with increasing $g_m/I_D$. By carefully controlling bias current and load capacitance, this topology can be used across a wide range of noise and speed requirements.

Referring back to FIG. 1, the topology shows a shared amplifier and comparator through the end of the first-stage quantization 115 and amplification phase. The second-stage 6 bit registration phase 125 utilizes the second comparator of FIG. 1 (at the output side of the overall ADC). Sharing the amplifier 110 and phase 1 comparator 115 has many advantages. One benefit is the reduction in hardware complexity, as no additional amplifier hardware is needed to enable residue amplification. Second, no offset calibration needs to be done and the comparator input pair (differential current transistors M1 and M2) can be sized only to meet noise requirements without regard for offset. With standard residue amplifiers, a mismatch between the amplifier and comparator offsets will cause an increase in the input swing seen by the amplifier. This increased output swing is especially harmful for dynamic open-loop amplifiers, where non-linearity is usually very sensitive to input swing. In the described amplifier topology, the offset seen during comparator operation and amplifier operation are the same, so even a very large offset will have no effect on the ADC functionality.

Figure 4A:
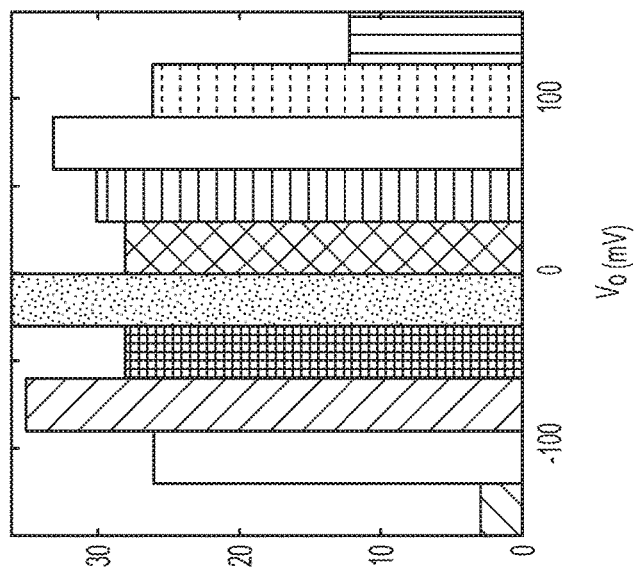
FIG. 4 shows histograms of simulated amplifier inputs (FIG. 4A) and outputs (FIG. 4B) with device mismatch enabled.
Figure 4B:
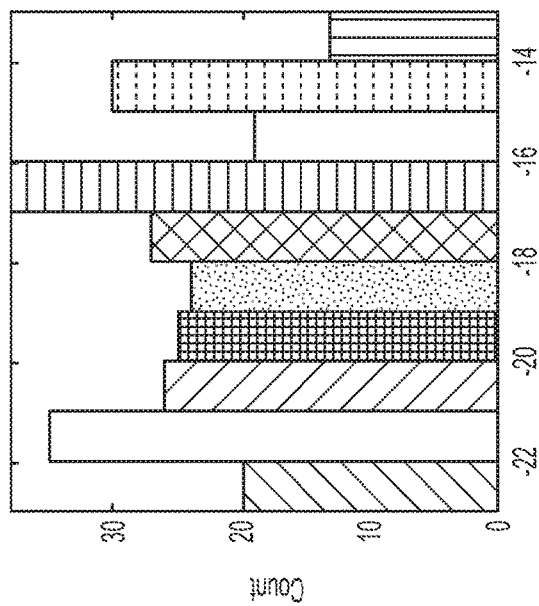

FIG. 4 shows histograms of simulated amplifier inputs (FIG. 4A) and outputs (FIG. 4B) with device mismatch enabled. Even though the comparator has an offset of approximately 18 mV, the amplifier output 177 shows no offset, since it sees the same 18 mV offset at its input. Finally, since the amplifier 110 sees the much larger second stage DAC capacitance in amplification phase, the noise and speed can be optimized separately for comparator and amplifier operating modes by changing the ratio of comparator parasitic capacitance to second-stage DAC capacitance. Table I shows a comparison of important performance parameters for an embodiment of the disclosed amplifier when it is in comparator and amplifier operation. When in comparator mode, the noise is only required to match the first-stage resolution, so the comparator can work in a high speed, high noise mode. Once the second stage DAC capacitance is connected, the amplifier 110 works in a low speed, low noise mode. Additionally, Table I shows that from an energy perspective, the amplifier operation is approximately equivalent to firing the comparator an extra two times, highlighting the power efficiency of the proposed amplification method. Sharing the amplifier and comparator reduces hardware complexity, eliminates offset calibration, and still enables separate optimization between comparator and amplifier operating modes.

TABLE I

PERFORMANCE COMPARISON BETWEEN COMPARATOR AND AMPLIFIER OPERATING MODES.

|  | Comparator | Amplifier |
| --- | --- | --- |
| Input-Referred Noise ($\mu V_{rms}$) | 344 | 101 |
| Integration Time (ns) | 0.98 | 5.2 |
| Regeneration Time Constant (ns) | 0.19 | 1.8 |
| Energy per Operation (fJ) | 86 | 148 |

Example

The following example(s) are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, voltages, etc.), but some errors and deviations should be accounted for.

An embodiment of the amplifier 110 described herein was integrated into the 12-bit, 10 MS/s two-stage SAR-based pipelined ADC, as shown in FIG. 1. The first-stage 115 resolution of 7 bits was chosen to reduce the amplifier input swing and eliminate the need for gain non-linearity calibration. Both SAR sub-ADCs use the bidirectional single-sided switching technique from L. Chen, A. Sanyal, J. Ma, and N. Sun, "A 24-µW 11-bit 1-MS/s SAR ADC with a bidirectional single-side switching technique," in 2014 IEEE ESSCIRC, September 2014, pp. 219-222, which is incorporated by reference, in order to minimize reference energy and reduce the required DAC capacitance. The $V_{cm}$ application from Chen was not used, as any error in the common-mode voltage will be amplified by the residue amplifier, greatly increasing the accuracy requirements for the common-mode voltage. Finally, redundant capacitors are added to overcome the common-mode voltage shifts that occur while using the bidirectional switching scheme. The redundant capacitors ensure the critical conversion cycle will happen after the common-mode voltage shifts become small. By doing this, the offset matching between the comparator operation and amplifier operation is maintained. A voltage controlled delay line (VCDL) is used to control the amplification time and its delay is tuned to a gain of 32. For a 7-bit first stage with 1 bit of redundancy the required gain is 64, and the effective gain is increased by an additional factor of two by using a separate reference voltage for the second stage that is half the voltage of the first stage reference.

Figure 5B:
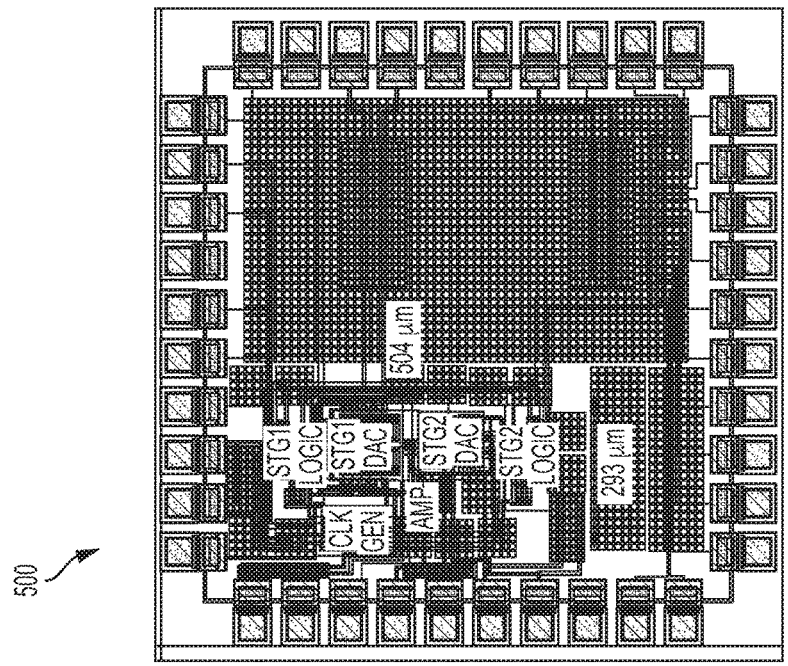
FIG. 5 shows a die photo (FIG. 5A) and layout of the chip (FIG. 5B) of a 12-bit, 10 MS/s two-stage SAR-based pipelined ADC fabricated in 130 nm CMOS technology.
Figure 5A:
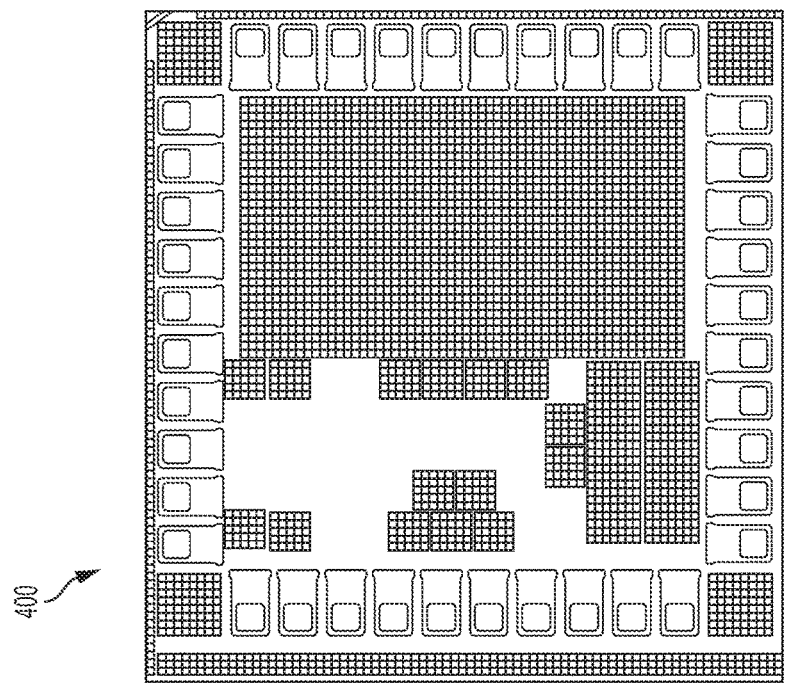
Figure 6:
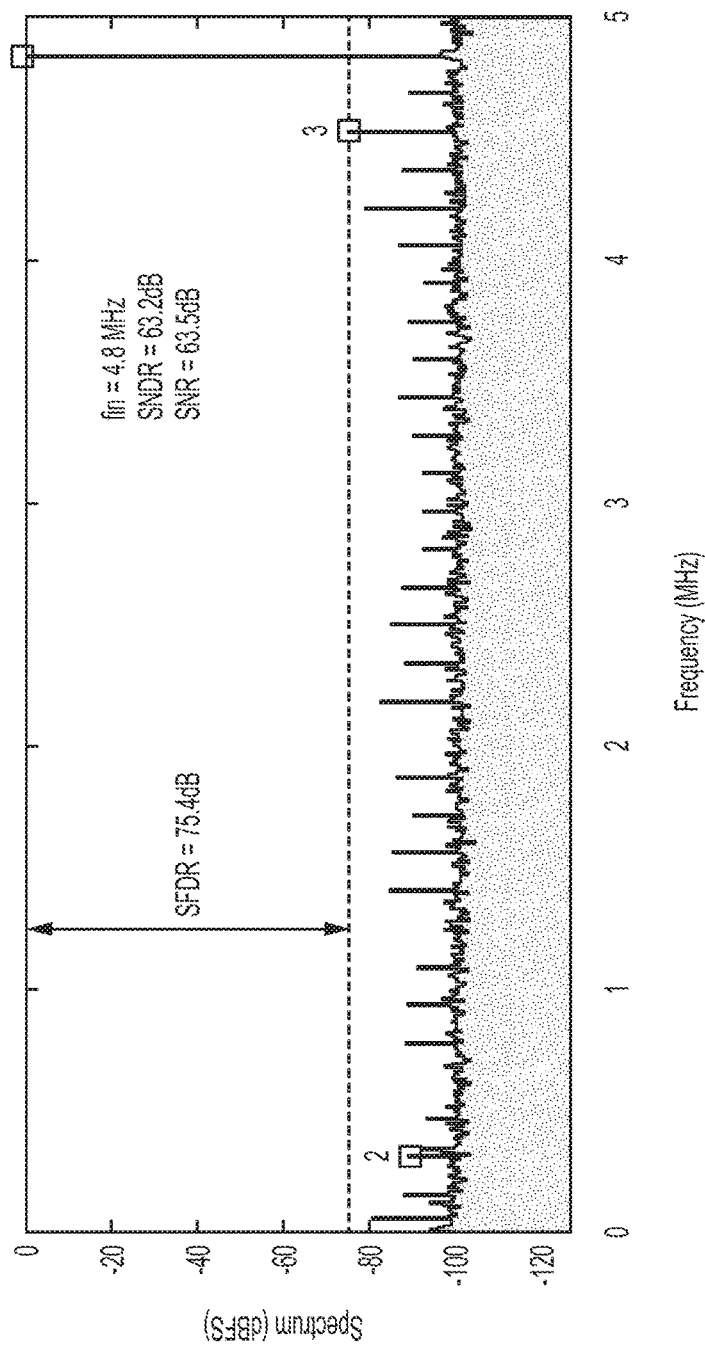
FIG. 6 shows the measured output spectrum of the SAR ADC of FIG. 5 with a Nyquist input.
Figure 7:
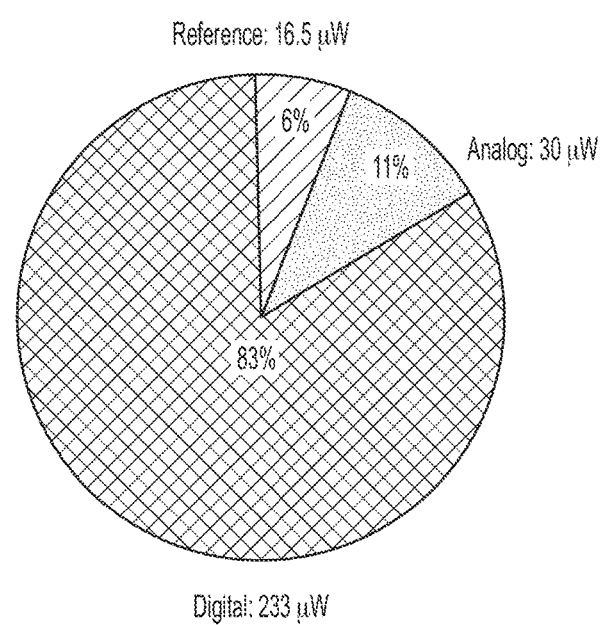
FIG. 7 shows the power breakdown between digital, analog, and reference power of the SAR ADS of FIG. 5.
Figure 8A:
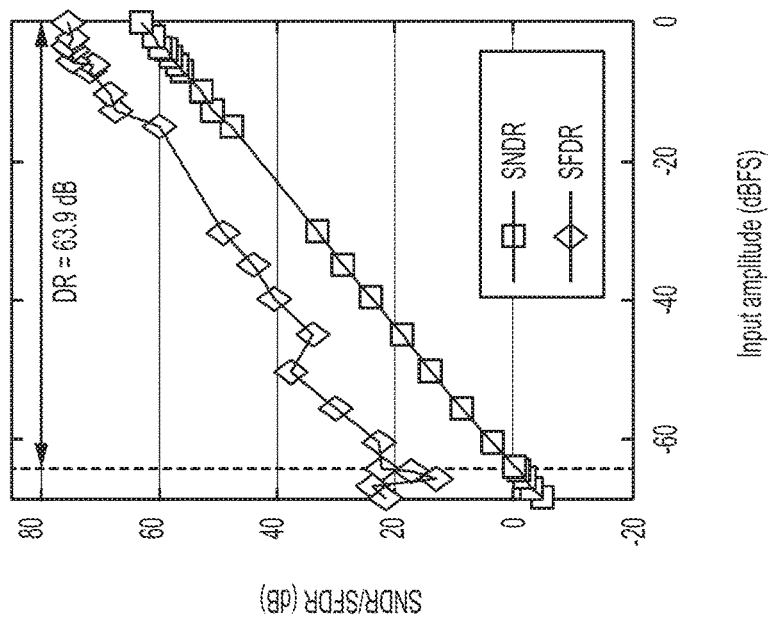
FIG. 8 shows the SNDR/SFDR across input frequency (FIG. 8A) and input amplitude (FIG. 8B) of the SAR ADS of FIG. 5.
Figure 8B:
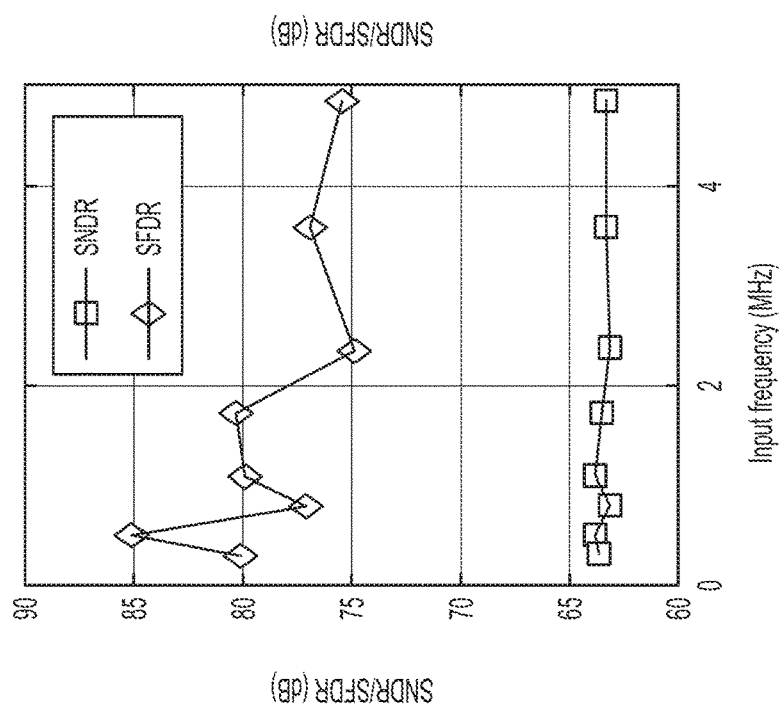

The 12-bit, 10 MS/s two-stage SAR-based pipelined ADC described above was fabricated in 130 nm CMOS technology. FIG. 5 shows the die 400 photo (FIG. 5A) and layout of the chip 500 (FIG. 5B). Capacitor mismatch and static gain error were calibrated in the foreground with a single input. FIG. 6 shows the measured ADC output spectrum (32,768 points) with a Nyquist input. The measured Signal-to-noise+distortion ratio, the ratio of signal power to (noise power plus spurious harmonics power), SNDR, and the spurious free dynamic range (SFDR), which is the dynamic range through which no non-linearity exists, at Nyquist was 63.2 dB and 75.4 dB, respectively, leading to a 10.2-bit effective number of bits (ENOB). The measured signal-to-noise ratio (SNR) was limited by the jitter of the VCDL, which caused a large amount of noise in the gain of the amplifier. The VCDL was connected to the digital supply, which is active during the amplification phase and causes the VCDL's delay to vary. Connecting the VCDL to a cleaner supply would likely remove this issue. The total measured power was 280 µW, of which 83% was digital power. FIG. 7 shows the power breakdown between digital, analog, and reference power. FIG. 8 shows the SNDR/SFDR across input frequency (FIG. 8A) and input amplitude (FIG. 8B). The SNDR is consistent across input frequency due to the VCDL jitter limitation, which has no frequency dependence. The dynamic range of the ADC was measured to be 63.9 dB. These numbers translate to a Schreier FoM (see R. Schreier and G. C. Temes, Understanding delta-sigma data converters. New York, N.Y.: Wiley, 2005, which is incorporated by reference), of 166.4 dB. Fabricating this ADC in more advanced processes would almost certainly show dramatic decreases in power consumption since the digital power is the vast majority of the overall power and all analog power is dynamic. Table II summarizes the measured performance of the ADC.

TABLE II

PERFORMANCE SUMMARY

| Resolution (Bits) | 12 |
|---|---|
| Process (nm) | 130 |
| Supply Voltage (V) | 1.2 |
| Active Area (mm$^2$) | 0.15 |
| Sampling Rate (MS/s) | 10 |
| SNDR (Nyq) (dB) | 63.2 |
| ENOB (Bits) | 10.2 |
| Power (µW) | 280 |
| Schreier FoM (dB) | 166.4 |

According to the above noted disclosure, embodiments of this disclosure may be described as follows, In one embodiment, a variable gain amplifier 110 utilizes positive feedback and time-domain calibration and includes an integration phase, wherein the integration phase reduces input-referred noise and offset, and provides increased linearity. The amplifier further includes a regeneration phase, wherein the regeneration phase provides high-speed amplification. A current source provides a bias current that increases linearity in the integration phase, reduces common-mode voltage dependence, and provides a dynamic mechanism to trade-off noise and linearity for speed. The amplifier 110 accesses a timing control loop (150, 160, 170, 180), wherein a variable gain of a residue amplifier is proportional to a time $\tau_{amp}$ that a timing control loop signal, clka, is kept high, as determined by an on or off status of respectively paired inverter assemblies each having an input voltage determined by an amplifier output voltage during the regeneration phase. The circuit implements a strong-arm latch structure, wherein once the amplifier 110 is in the regeneration phase, the strong arm latch acts as a positive feedback latch until clka is deasserted, wherein the variable gain amplifier utilizing positive feedback and time-domain calibration consumes no static power.

In another embodiment, the circuit 100 of FIG. 1 is an analog to digital converter that includes an initial coarse quantization phase 115 for an analog input connected to a positive input terminal (Vin,p) and a negative input terminal (Vin,n), the coarse quantization phase 115 includes a comparator clock input (clk) on respective gates of a first reset transistor (M7), a second reset transistor (M8), a third reset transistor (M9), a fourth reset transistor (M10), and an enable transistor (M12), wherein the reset transistors are configured to initialize an amplifier having, a set of internal amplifier nodes (Vxp, Vxn) to a constant state and to minimize static current consumed by the amplifier 100. An enable transistor (M12) is configured to enable current flow through the amplifier. First and second differential current transistors (M1, M2) are connected, respectively, between a first cascode transistor (M3), enable transistor (M12), second cascode transistor (M4), and enable transistor (M12). A constant bias current from the source terminals of M1 and M2 to ground is determined by a bias voltage (Vbias) on a current source transistor gate (M13). First and second cascode transistors (M3, M4) are connected between respective differential current transistors (M1, M2) and respective output terminals (Vop, Von), wherein during the integration phase, a differential current through transistors M1 and M2 is initially integrated on transistor parasitic capacitors (Cx) until a node voltage Vx drops to a voltage level that turns on cascode transistors (M3, M4) such that the differential current is then integrated onto an output load (Co) decreasing an output voltage at output nodes ($V_{op}/V_{on}$). A regeneration phase 125 for the initial differential voltage at output nodes ($V_{op}/V_{on}$) is initiated by the output voltage at nodes $V_{op}/V_{on}$ dropping to a lower voltage to turn on positive feedback transistors (M5, M6) connected between a common drain terminal (Vdd) and the output load (Co). The regeneration phase 125 includes a positive residue terminal (Vresp) and a negative residue terminal (Vresn) connected, respectively, to the first differential current transistor (M1) gate and second differential current transistor (M2) gate in a terminal polarity orientation (Vresn, Vresp) opposite the output terminals (Vop, Von). An amplifier clock input (clka) is configured to control the load capacitance until the gain applied to the residue input reaches a preset value.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A variable gain amplifier utilizing positive feedback and time-domain calibration comprising:
   an integration phase, wherein the integration phase reduces input-referred noise and offset, and provides increased linearity;
   a regeneration phase, wherein the regeneration phase provides high-speed amplification;
   a current source, wherein the current source provides a bias current that increases linearity in the integration phase, reduces common-mode voltage dependence, and provides a dynamic mechanism to trade-off noise and linearity for speed;
   a timing control loop, wherein a variable gain of a residue amplifier is proportional to a time $\tau_{amp}$ that a timing control loop signal, clka, is kept high, as determined by an on or off status of respectively paired inverter assemblies each having an input voltage determined by an amplifier output voltage during the regeneration phase; and
   a strong-arm latch structure, wherein once the amplifier is in the regeneration phase, said strong arm latch acts as a positive feedback latch until clka is deasserted,
   wherein the variable gain amplifier utilizing positive feedback and time-domain calibration consumes no static power.

2. The variable gain amplifier utilizing positive feedback and time domain calibration of claim 1, wherein the integration phase comprises transistors M1, M2, M3, M4, PMOS transistors M5 and M6, current source M13 and nodes $V_{xp}/V_{xn}$, $C_x$, $V_{op}/V_{on}$, and Vbias, wherein during the integration phase, a differential current through transistors M1 and M2 is initially integrated on a capacitance at the nodes $V_{xp}/V_{xn}$, $C_x$, and once the Vx node voltages decrease enough to turn on transistors M3 and M4, the differential current is then integrated onto an output load until the voltage at nodes $V_{op}/V_{on}$ drops below a threshold voltage of positive feedback PMOS transistors M5 and M6.

3. The variable gain amplifier utilizing positive feedback and time domain calibration of claim 2, wherein the amplifier is used as a comparator between a first stage and a second stage of a SAR ADC.

4. The variable gain amplifier utilizing positive feedback and time domain calibration of claim 3, wherein when the clka signal is low, capacitance of the second stage of the SAR ADC is disconnected from the amplifier and the amplifier behaves as a normal comparator.

5. The variable gain amplifier utilizing positive feedback and time domain calibration of claim 3, wherein the output load comprises a parallel combination of the second stage ADC capacitance, $C_{s2}$, and parasitic capacitance of the comparator, $C_o$.

6. The variable gain amplifier utilizing positive feedback and time domain calibration of claim 5, wherein gain at the end of the integration phase, $G_{int}$, approximately comprises $$G_{int} \approx \left(\frac{g_m}{I_D}\right)_{1,2} \left\{ V_{T5,6} + \frac{C_X}{C_{s2} + C_0}(V_{T5,6} + V_{T3,4}) \right\}.$$

7. The variable gain amplifier utilizing positive feedback and time domain calibration of claim 6, wherein at the end of the regeneration phase, the total amplifier gain, G, is approximately $G \approx G_{int} \cdot e^{T_{regen}/\tau}$, where $T_{regen}$ is the total regeneration time and $\tau$ is the regeneration time constant, given by $$\tau \approx \frac{C_{s2} + C_0}{g_{m5,6}}.$$

8. The variable gain amplifier utilizing positive feedback and time domain calibration of claim 7, wherein during the integration phase, the total amplifier gain, G, grows linearly and in the regeneration phase the total amplifier gain, G, grows exponentially.

9. The variable gain amplifier utilizing positive feedback and time domain calibration of claim 5, wherein in the integration phase, the input-referred noise is inversely proportional to integration time, which is controlled by the time which M5, M6 move from the off state to the on state, the bias current and load capacitance.

10. The variable gain amplifier utilizing positive feedback and time domain calibration of claim 9, wherein noise from the regeneration stage is attenuated by the gain from the integration stage.

11. The variable gain amplifier utilizing positive feedback and time domain calibration of claim 9, wherein the integration time can be maximized by reducing the bias current.

12. The variable gain amplifier utilizing positive feedback and time domain calibration of claim 9, wherein the bias current can be increased to minimize integration time.

13. An analog to digital converter comprising:
   an initial coarse quantization phase for an analog input connected to a positive input terminal (Vin,p) and a negative input terminal (Vin,n), the coarse quantization phase comprising
   a comparator clock input (clk) on respective gates of a first reset transistor (M7), a second reset transistor (M8), a third reset transistor (M9), a fourth reset transistor (M10), and an enable transistor (M12), said reset transistors configured to initialize an amplifier comprising a set of internal amplifier nodes to a constant state and to minimize static current consumed by the amplifier, and said enable transistor configured to enable current flow through the amplifier;

first and second differential current transistors (M1, M2) connected, respectively, between a first cascode transistor (M3), enable transistor (M12), and second cascode transistor (M4), and enable transistor (M12)

a constant bias current from the source terminals of M1 and M2 to ground determined by a bias voltage (Vbias) on a current source transistor gate (M13);

first and second cascode transistors (M3, M4) connected between respective differential current transistors (M1, M2) and respective output terminals (Vop, Von), wherein during the integration phase, a differential current through transistors M1 and M2 is initially integrated on transistor parasitic capacitors (Cx) until a node voltage Vx drops to a voltage level that turns on cascode transistors (M3, M4) such that the differential current is then integrated onto an output load (Co) decreasing an output voltage at output nodes ($V_{op}/V_{on}$);

a regeneration phase for the initial differential voltage at output nodes ($V_{op}/V_{on}$), said regeneration phase initiated by the output voltage at nodes $V_{op}/V_{on}$ dropping to a lower voltage to turn on positive feedback transistors (M5, M6) connected between a common drain terminal (Vdd) and the output load (Co), the regeneration phase comprising:

a positive residue terminal (Vresp) and a negative residue terminal (Vresn) connected, respectively, to the first differential current transistor (M1) gate and second differential current transistor (M2) gate in a terminal polarity orientation (Vresn, Vresp) opposite the output terminals (Vop, Von); and an amplifier clock input (clka) configured to control the load capacitance until the gain applied to the residue input reaches a preset value.

14. An analog to digital converter according to claim 13, wherein said amplifier clock input (clka) is asserted after a number of predetermined cycles of said comparator clock input (clk).

15. An analog to digital converter according to claim 13, wherein upon said amplifier clock input (clka) going high, said comparator clock (clk) enacts a timing control loop keeping said amplifier clock input (clka) high for a set delay period tau, $\tau_{amp}$.

16. An analog to digital converter according to claim 13, wherein upon said amplifier clock (clka) going low, a second-stage comparator clock (clk2) is asserted onto a second stage comparator to register respective output bits from the fine analog to digital conversion process corresponding to the second-stage clock input (clk2).

17. An analog to digital converter according to claim 13, wherein during the integration phase, the respective output bits are determined in a comparison of a differential input voltage Vin,p, Vin,n with a differential voltage generated by the SAR capacitive DAC with reference voltages Vref,p, Vref,n.

18. An analog to digital converter according to claim 13, wherein during the fine quantization phase, the respective output bits are determined by the second stage comparator completing a comparison of a differential input voltage Voc,p, Voc,n with a differential voltage generated by the SAR capacitive DAC with reference voltages Vref,p2, Vref,n2.

19. An analog to digital converter according to claim 13, further comprising a main sample clock clks that is low during coarse quantization and high during input voltage tracking.

20. An analog to digital converter according to claim 13, further comprising high and low capacitors registering bits during the initial coarse quantization phase and successive quantization of the fine second stage.

* * * * *